(12) United States Patent
Chandrasekaran

(10) Patent No.: US 8,310,061 B2
(45) Date of Patent: Nov. 13, 2012

(54) STACKED DIE PARALLEL PLATE CAPACITOR

(75) Inventor: Arvind Chandrasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 171 days.

(21) Appl. No.: 12/336,787

(22) Filed: Dec. 17, 2008

(65) Prior Publication Data

US 2010/0148373 A1 Jun. 17, 2010

(51) Int. Cl.
*H01L 23/48* (2006.01)
*H01L 23/52* (2006.01)
*H01L 29/40* (2006.01)

(52) U.S. Cl. ........ 257/777; 257/528; 257/532; 257/686; 257/778; 257/E23.013; 257/E23.023; 257/E23.079; 257/E23.142; 257/E25.023; 257/E29.343

(58) Field of Classification Search .................. 257/532, 257/676, 723, 528, 686, 777, 778, E23.013, 257/E25.023, E23.079, E29.343, E23.023; 361/301.4; 438/107, 109, 110, 123
See application file for complete search history.

(56) References Cited

U.S. PATENT DOCUMENTS

| | | | | |
|---|---|---|---|---|
| 5,034,850 A * | 7/1991 | Hernandez et al. | ........ | 361/306.2 |
| 5,172,304 A * | 12/1992 | Ozawa et al. | .................. | 361/763 |
| 5,177,670 A * | 1/1993 | Shinohara et al. | ............ | 361/738 |
| 5,272,590 A * | 12/1993 | Hernandez | ................. | 361/306.2 |
| 5,311,057 A * | 5/1994 | McShane | ...................... | 257/676 |
| 5,323,060 A * | 6/1994 | Fogal et al. | .................... | 257/777 |
| 6,054,754 A * | 4/2000 | Bissey | ............................. | 257/666 |
| 6,191,479 B1 * | 2/2001 | Herrell et al. | .................. | 257/724 |
| 6,291,931 B1 * | 9/2001 | Lakin | ............................. | 310/364 |
| 6,433,993 B1 * | 8/2002 | Hunt et al. | ..................... | 361/303 |
| 6,608,375 B2 * | 8/2003 | Terui et al. | ..................... | 257/691 |
| 6,943,294 B2 * | 9/2005 | Kang et al. | ..................... | 174/541 |
| 6,979,894 B1 * | 12/2005 | Sutardja | ........................ | 257/686 |
| 6,995,463 B1 * | 2/2006 | Sutardja | ........................ | 257/686 |
| 7,064,444 B2 * | 6/2006 | Lee et al. | ....................... | 257/777 |
| 7,112,878 B2 * | 9/2006 | Akram | .......................... | 257/686 |
| 7,772,683 B2 * | 8/2010 | Jang et al. | ..................... | 257/685 |
| 2002/0003294 A1 * | 1/2002 | Bissey | .......................... | 257/676 |
| 2002/0057830 A1 * | 5/2002 | Akin et al. | ..................... | 382/147 |
| 2003/0015783 A1 * | 1/2003 | Schaper | ........................ | 257/691 |
| 2003/0205826 A1 * | 11/2003 | Lin et al. | ....................... | 257/777 |
| 2004/0021210 A1 * | 2/2004 | Hosomi | ......................... | 257/686 |
| 2004/0126981 A1 * | 7/2004 | Rao et al. | ...................... | 438/396 |
| 2004/0212083 A1 * | 10/2004 | Yang | ............................. | 257/723 |
| 2004/0251529 A1 * | 12/2004 | Lee et al. | ...................... | 257/686 |

(Continued)

OTHER PUBLICATIONS

International Search Report—PCT/US2009/067666, International Search Authority—European Patent Office Mar. 2, 2010.

(Continued)

*Primary Examiner* — Thao Le
*Assistant Examiner* — Eric Jones
(74) *Attorney, Agent, or Firm* — Sam Talpalatsky; Nicholas J. Pauley; Jonathan T. Velasco

(57) ABSTRACT

A stacked integrated circuit having a first die with a first surface and a second die with a second surface facing the first surface, the stacked integrated circuit includes a capacitor. The capacitor is formed by a first conducting plate on a region of the first surface, a second conducting plate on a region of the second surface substantially aligned with the first conducting plate, and a dielectric between the first conducting electrode and the second conducting electrode.

25 Claims, 3 Drawing Sheets

U.S. PATENT DOCUMENTS

| | | | |
|---|---|---|---|
| 2005/0157447 A1* | 7/2005 | Jow et al. | 361/306.3 |
| 2006/0194366 A1* | 8/2006 | Lee et al. | 438/106 |
| 2007/0001298 A1* | 1/2007 | Ozawa et al. | 257/723 |
| 2007/0075413 A1* | 4/2007 | Egawa | 257/686 |
| 2008/0116558 A1* | 5/2008 | Kang et al. | 257/686 |
| 2010/0117192 A1* | 5/2010 | Lee et al. | 257/532 |
| 2010/0148373 A1* | 6/2010 | Chandrasekaran | 257/778 |

OTHER PUBLICATIONS

Written Opinion—PCT/ US2009/067666, International Search Authority—European Patent Office Mar. 2, 2010.

* cited by examiner

STACKED DIE PARALLEL PLATE CAPACITOR

TECHNICAL FIELD

The present disclosure generally relates to integrated circuits (ICs). More specifically, the present disclosure relates to stacked ICs, and even more specifically to capacitors used in stacked ICs.

BACKGROUND

Integrated circuits (ICs) are fabricated on substrates. Commonly, these substrates are semiconductor materials, and, in particular, silicon. As circuits increase in complexity, the number of transistors that are included in integrated circuits has increased. As complexity has increased, demand for smaller and more portable electronics has resulted in a conflict between the number of transistors in the integrated circuit and the size of the integrated circuit.

Transistor sizes have shrunk from, most recently, 65 nm to 45 nm, and will soon reach 32 nm. This reduction results in an increased density of the number of transistors in each unit of square area. Increasing transistor densities has allowed integrated circuits to continue to increase in complexity while also fitting in compact form factors, such as cellular phones. Currently, integrated circuits contain only one level of semiconductor dies. However, building multiple layers of semiconductor dies could increase the density of transistors several fold.

Stacked ICs are one route allowing continued expansion of the complexity of integrated circuits while reducing their size. Multiple substrates, each containing a layer of integrated circuits, may be stacked on top of each other resulting in a die with higher density of transistors in a given area than that of a single layer. Fabrication cost of integrated circuits is relative to the area consumed on a die, and hence, stacking two layers of integrated circuits in one die may be less expensive than building two separate dies.

In addition to transistors, integrated circuits include passive components such as capacitors. One challenge to designing integrated circuits is the placement of passive components around transistors in an efficient manner. As mentioned earlier, there is an economical advantage to reducing the amount of area consumed on a die. Still, there are areas of the die that are not used for active circuitry that could otherwise be used for passive structures.

Capacitors are used extensively in integrated circuits and several methods to incorporate them into the die exist. Such methods include soldering discrete elements onto either a packaging substrate or a board on which the die will eventually be mounted. Capacitive elements may also be built in the active circuitry. These methods all consume area on the die. It is advantageous to reduce the area consumed by passive structures as much as possible.

One structure with an extremely small footprint is the metal-insulator-metal (MIM) capacitor. Although offering a small footprint, the MIM capacitor still consumes area that otherwise could be used for active circuitry.

Thus, there is a need for a capacitive device that may be integrated into stacked ICs without consuming active area.

BRIEF SUMMARY

According to one aspect of the disclosure, a stacked integrated circuit includes a first die with a first surface and a second die with a second surface facing the first surface, the stacked integrated circuit includes a capacitor. The capacitor is formed by a first conducting plate on a region of the first surface, a second conducting plate on a region of the second surface substantially aligned with the first conducting plate, and a dielectric between the first conducting electrode and the second conducting electrode.

According to another aspect of the disclosure, a stacked integrated circuit device includes a first die. The first die has a first surface including a first conducting plate. The stacked IC also includes a second die stacked with the first die. The second die has a second surface that faces the first surface of the first die. The second surface includes a second conducting plate that opposes the first conducting plate. The stacked IC further includes an insulator between the first die and the second die. The first conducting plate, the second conducting plate, and the insulator form a capacitor.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
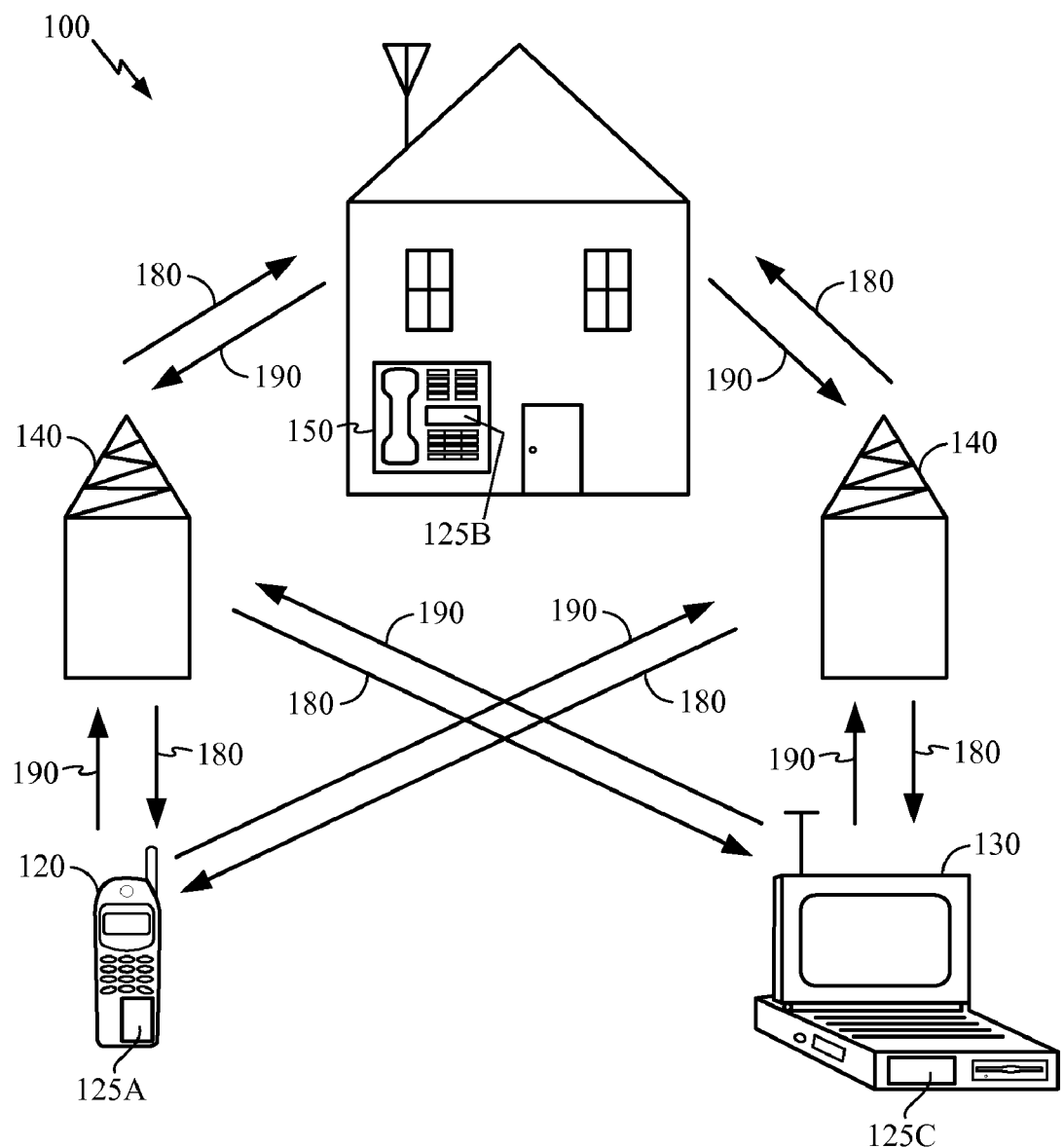
FIG. 1 is a block diagram showing an exemplary wireless communication system in which an embodiment of the disclosure may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that typical wireless communication systems may have many more remote units and base stations. Remote units 120, 130, and 150 include IC devices 125A, 125B and 125C, that include the circuitry disclosed here. It will be recognized that any device containing an IC may also include the circuitry disclosed here, including the base stations, switching devices, and network equipment. FIG. 1 shows forward link signals 180 from the base stations 140 to the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 1 illustrates remote units according to the teachings of the disclosure, the disclosure is not limited to these exemplary illustrated units. The disclosure may be suitably employed in any device which includes integrated circuits, as described below.

Figure 2:
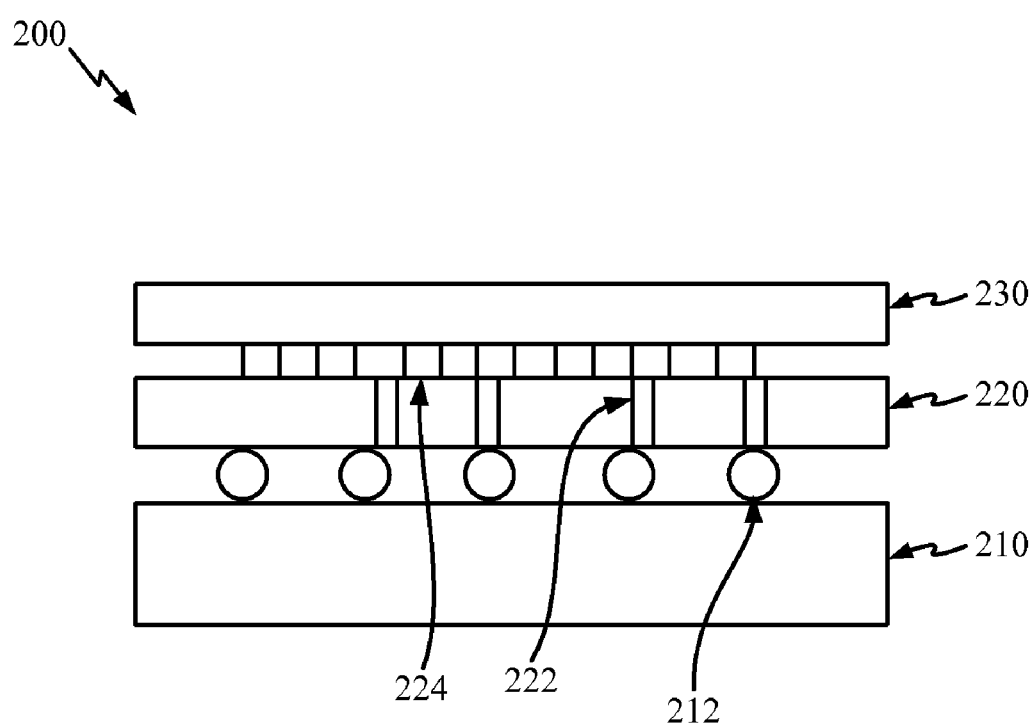
FIG. 2 is a cross-sectional view illustrating a stacked IC in which an embodiment of the disclosure may be advantageously employed.

FIG. 2 is a cross-sectional view illustrating a stacked IC in which an embodiment of the disclosure may be advantageously employed. A stacked IC 200 includes a packaging substrate 210, a first die 220, and a second die 230. A flip chip bump 212 couples the first die 220 to the packaging substrate 210. Although flip chip bumps are illustrated, any structure may be used to couple the first die 220 to the packaging substrate 210. Additionally, a microbump 224 couples the second die 230 to the first die 220. Although microbumps are illustrated, any suitable structure may couple the second die 230 to the first die 220. A through silicon via 222 is illustrated to demonstrate coupling of the second die 230 to the packaging substrate 210. The stacked IC 200 may be, for example, packaged as a flip-chip.

Although microbumps offer dense packing of interconnects between a first die and second die, there still remain regions between the two dies that are not used for circuitry. A large portion of this unused space is in the periphery of the die. In one embodiment, the spacing between two dies is 5-30 µm. This spacing allows a parallel-plate capacitor to be built between the dies in the periphery. The parallel-plate capacitor can be formed by depositing a metallization layer on two dies facing each other and filling the remaining space with a dielectric such as, for example, the mold compound otherwise used to bond the two dies 220, 230 together.

Figure 3:
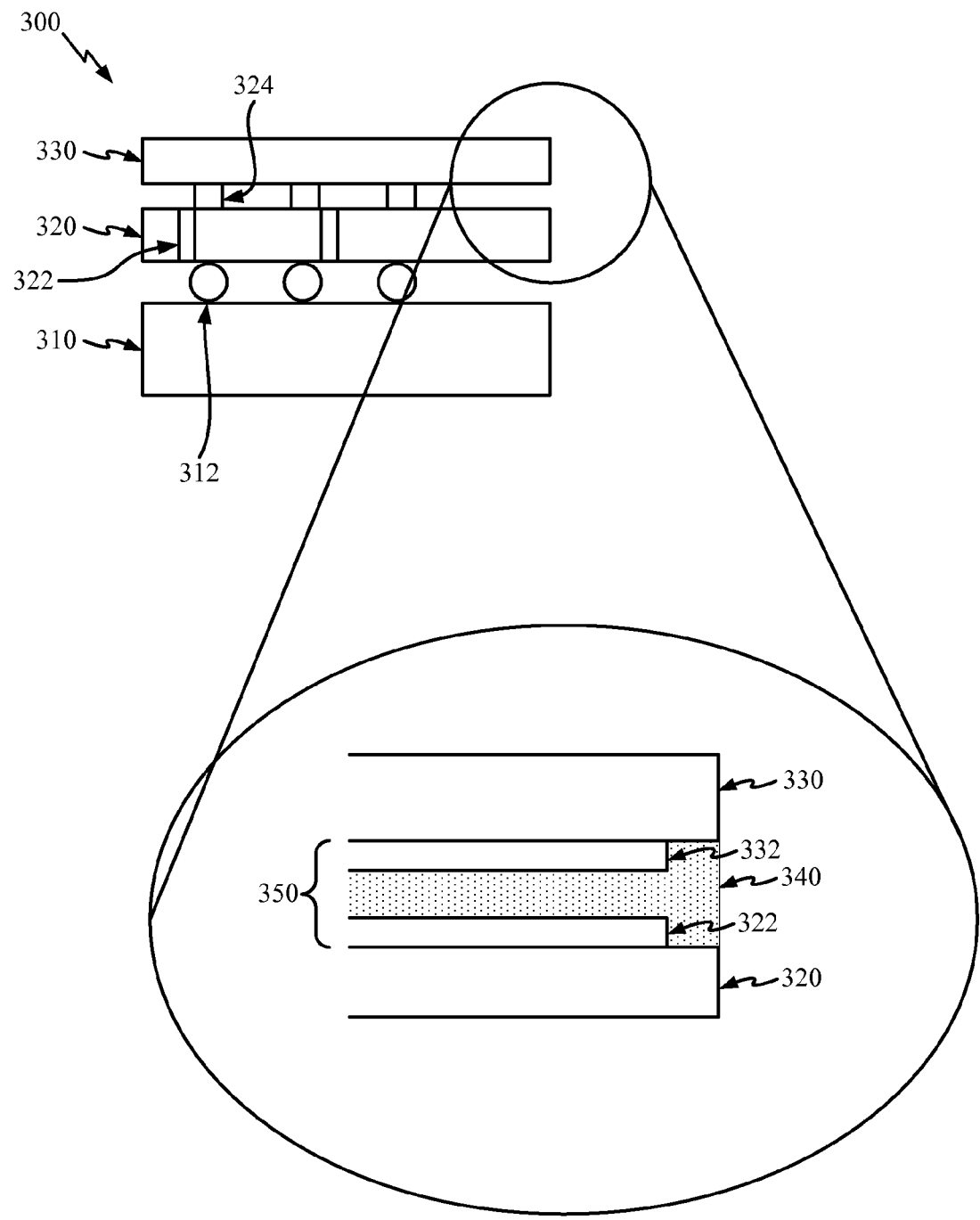
FIG. 3 is a cross-sectional view illustrating a stacked IC having a stacked die parallel plate capacitor according to one embodiment of the disclosure.

Turning now to FIG. 3, a parallel-plate structure between two dies of an IC is examined. FIG. 3 is a cross-sectional view illustrating a stacked IC having a stacked die parallel plate capacitor according to one embodiment of the disclosure. A stacked IC 300 includes a packaging substrate 310, a first die 320, and a second die 330. A flip chip bump 312 couples the first die 320 to the packaging substrate 310. Although flip chip bumps are illustrated, any structure may be used to couple the first die 320 to the packaging substrate 310. Additionally, a microbump 324 couples the second die 330 to the first die 320. Although microbumps are illustrated, any suitable structure may couple the second die 330 to the first die 320. A through silicon via 322 is illustrated to demonstrate coupling of the second die 330 to the packaging substrate 310. The stacked IC 300 may be, for example, packaged as a flip-chip.

A close up view of a periphery of the stacked IC 300 is now examined. The periphery is a region of the stacked IC 300 that does not contain other microelectronics circuitry. This may be, for example, at the outer edges of the stacked IC 300. Although the periphery of the stacked IC 300 is shown, the parallel-plate structure may be built in any region of the IC. The first die 320 includes a conducting plate 322 and the second die 330 includes a conducting plate 332. The conducting plate 332 faces the conducting plate 322. The conducting plate 332 may be less than 1 µm and may be a metal such as copper. A mold compound 340 bonds the first die 320 to the second die 330 and acts as the insulating layer of a capacitor 350. In another embodiment, the first die 320 and second die 330 may be held together by other techniques such as vacuum seals. In such a technique, air or vacuum would exist between the conducting plate 322 and the conducting plate 332 and act as the insulator. The capacitor has the conducting plate 322 and the conducting plate 332 as electrodes.

Contacts to the parallel-plate capacitor 350 formed between stacked dies 320, 330 may be accomplished in a number of ways. For example, through silicon vias (not shown) may extend through either die 320, 330 to contact the conducting plates 322, 332 forming the electrodes of the capacitor 350.

The capacitance, c, of a parallel-plate capacitor is given by $$c = \epsilon_0 \epsilon_r / d$$

where $\epsilon_r$ is the relative permittivity of the dielectric, $\epsilon_0$ is the vacuum permittivity, and d is the distance between the two metal plates.

As an example, a parallel-plate capacitor as formed in the embodiment of FIG. 3 may have a distance, d, of 10 µm, and a relative permittivity, $\epsilon_r$, of 3 for mold compound. The resulting capacitance per area is $2.66 \times 10^{-3}$ femtoFarads/µm². If an area of 100 µm×100 µm of the unused space on a die is used for a stacked-die parallel plate capacitor, the total capacitance would be 27 femtoFarads. Capacitors with capacitance values of this magnitude may be useful in stacked integrated circuits to function as decoupling capacitors or matching circuits.

Advantages of the stacked-die parallel-plate capacitor include the use of existing fabrication techniques. Therefore, no new processes need to be added to the fabrication of stacked ICs. This allows the capacitors to be built with little additional cost. Moreover, the capacitors occupy otherwise unused space on the die. Therefore, the implementation of the capacitors in stacked ICs does not result in larger die sizes. As a result there is no additional cost for the capacitors related to area of the die consumed by components. Additionally, by building capacitors into the stacked IC, the number of capacitors built into external components of the IC may be reduced.

Although only two dies are described in the embodiments set forth, there may be many more dies contained in a stacked IC. If more than two dies are used the capacitor structure as disclosed may be placed between any two dies, all of the dies, or other such configurations.

Stacked ICs as set forth in the disclosure may contain logic circuitry such as microprocessors, memory devices, or a combination of the two. The stacked IC may be integrated into devices that employ the microprocessors or memory devices. For example, the stacked IC may be part of a communications device. Of course the stacked ICs may include other types of circuitry without departing from the scope and spirit of the invention.

Although specific circuitry has been set forth, it will be appreciated by those skilled in the art that not all of the disclosed circuitry is required to practice the disclosure. Moreover, certain well known circuits have not been described, to maintain focus on the disclosure. Although the terminology "through silicon via" includes the word silicon, it is noted that through silicon vias are not necessarily constructed in silicon. Rather, the material can be any device substrate material.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and processes described in the specification. As one of ordinary skill in the art will readily appreciate from the disclosure, processes, machines, manufacture, compositions of matter, means, methods, or processes, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or processes.

What is claimed is:

1. A stacked integrated circuit, comprising:
a first die with a first surface and a second die with a second surface facing the first surface;
a plurality of microbumps coupling the first surface of the first die to the second surface of the second die, the microbumps fully structurally supporting the second die and electrically coupling the first die and the second die; and
a capacitor formed to comprise a first conducting plate on a region of the first surface where no microbump is coupled to the first surface, a second conducting plate on a region of the second surface substantially aligned with the first conducting plate, and a dielectric between the first conducting electrode and the second conducting electrode, the dielectric contacting a portion of the first and second surfaces of the dies, the capacitor being disposed between a side wall of the first die or a sidewall of the second die at an outer edge of the stacked integrated circuit and a microbump of the plurality of microbumps to the outer edge of the stacked integrated circuit.

2. The stacked integrated circuit of claim 1, in which the first conducting plate is copper.

3. The stacked integrated circuit of claim 1, in which the dielectric comprises a mold compound.

4. The stacked integrated circuit of claim 1, in which a space between the first conducting plate and the second conducting plate is five to thirty micrometers.

5. The stacked integrated circuit of claim 1, in which the thickness of the first conducting plate is less than 1 micron.

6. The stacked integrated circuit of claim 1, in which the thickness of the second conducting plate is less than 1 micron.

7. The stacked integrated circuit of claim 1, in which the first die further comprises through vias.

8. The stacked integrated circuit of claim 7, in which the through vias couple to the first conducting plate.

9. The integrated circuit of claim 1, further comprising a packaging substrate bonded to the first die.

10. The integrated circuit of claim 9, in which the integrated circuit is a flip-chip.

11. The integrated circuit of claim 1 in which the first conducting plate on the first surface is located only in a periphery of the stacked IC.

12. The integrated circuit of claim 1, in which the second conducting plate on the second surface is located only in a periphery of the stacked IC.

13. The stacked integrated circuit of claim 1, in which the first die further comprises a microprocessor.

14. The stacked integrated circuit of claim 1, in which the second die further comprises memory circuitry.

15. The integrated circuit of claim 1, in which the integrated circuit is incorporated into a communications device.

16. The stacked integrated circuit of claim 1, in which the stacked integrated circuit is integrated into a portable computer, a cell phone, a fixed location remote unit, a mobile telephone, a portable data unit, a hand-held personal communication systems unit, a personal data assistant, a meter reading equipment, and/or a fixed location data unit.

17. A stacked integrated circuit, comprising:
a first die, having a first surface comprising a first conducting plate formed on a portion of the first surface;
a second die stacked with the first die, the second die having a second surface facing the first surface of the first die, the second surface comprising a second conducting plate formed on a portion of the second surface, and the second conducting plate opposing the first conducting plate;
a plurality of microbumps electrically coupling the second die to the first die, and also fully structurally supporting the second die;
a mold compound between the first die and the second die, the mold compound coupling the first die to the second die; and
a capacitor formed to comprise the first conducting plate, the second conducting plate, and the mold compound, the capacitor being disposed between either a side wall of the first die or a sidewall of the second die at an outer edge of the stacked integrated circuit and a microbump of the plurality of microbumps closest to the outer edge of the stacked integrated circuit.

18. The stacked integrated circuit of claim 17, in which the space between the first conducting plate and the second conducting plate is ten to thirty micrometers.

19. The stacked integrated circuit of claim 17, in which the thickness of the first conducting plate is less than 1 micron.

20. The stacked integrated circuit of claim 17, in which the thickness of the second conducting plate is less than 1 micron.

21. The stacked integrated circuit of claim 17, in which the stacked integrated circuit is integrated into a portable computer, a cell phone, a fixed location remote unit, a mobile telephone, a portable data unit, a hand-held personal communication systems unit, a personal data assistant, a meter reading equipment, and/or a fixed location data unit.

22. A stacked integrated circuit, comprising:
a first die with a first surface and a second die with a second surface facing the first surface;
means for coupling the first surface of the first die to the second surface of the second die, the coupling means being closest to an outer edge of the stacked integrated circuit and electrically coupling the first die and the second die; and
a capacitor formed to comprise a first conducting plate on a region of the first surface where no coupling means is coupled to the first surface, a second conducting plate on a region of the second surface substantially aligned with the first conducting plate, and a dielectric between the first conducting electrode and the second conducting electrode, the dielectric contacting a portion of the first and second surfaces of the dies, the capacitor being disposed between the coupling means closest to an outer edge of the stacked integrated circuit and a side wall of the first die or a sidewall of the second die at the outer edge of the stacked integrated circuit.

23. The stacked integrated circuit of claim 22, in which the stacked integrated circuit is integrated into a portable computer, a cell phone, a fixed location remote unit, a mobile telephone, a portable data unit, a hand-held personal communication systems unit, a personal data assistant, a meter reading equipment, and/or a fixed location data unit.

24. A stacked integrated circuit, comprising:
a first die, having a first surface comprising a first conducting plate formed on a portion of the first surface;
a second the stacked with the first die, the second die having a second surface facing the first surface of the first die, the second surface comprising a second conducting plate formed on a portion of the second surface, and the second conducting plate opposing the first conducting plate;
means for electrically coupling the second die to the first die, the coupling means being closest to an outer edge of the stacked integrated circuit;
a mold compound between the first die and the second die, the mold compound coupling the first die to the second die; and
a capacitor formed to comprise the first conducting plate, the second conducting plate, and the mold compound, the capacitor being disposed between the coupling means and either a side wall of the first die or a sidewall of the second die at the outer edge of the stacked integrated circuit.

25. The stacked integrated circuit of claim 24, in which the stacked integrated circuit is integrated into a portable computer, a cell phone, a fixed location remote unit, a mobile telephone, a portable data unit, a hand-held personal communication systems unit, a personal data assistant, a meter reading equipment, and/or a fixed location data unit.

* * * * *